(12) United States Patent
JangJian et al.

(10) Patent No.: US 9,024,369 B2
(45) Date of Patent: May 5, 2015

(54) METAL SHIELD STRUCTURE AND METHODS FOR BSI IMAGE SENSORS

(71) Applicant: Taiwan Semiconductor Manufacturing Company, Ltd., Hsin-Chu (TW)

(72) Inventors: Shiu-Ko JangJian, Tainan (TW); Chi-Cherng Jeng, Madou Township (TW); Volume Chien, Sinying (TW); Ying-Lang Wang, Tien-Chung Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 171 days.

(21) Appl. No.: 13/718,688

(22) Filed: Dec. 18, 2012

(65) Prior Publication Data

US 2014/0167197 A1 Jun. 19, 2014

(51) Int. Cl.
*H01L 31/113* (2006.01)
*H01L 31/062* (2012.01)
*H01L 31/18* (2006.01)
*H01L 27/146* (2006.01)

(52) U.S. Cl.
CPC .......... *H01L 31/18* (2013.01); *H01L 27/14643* (2013.01); *H01L 27/1462* (2013.01); *H01L 27/14623* (2013.01); *H01L 27/1463* (2013.01); *H01L 27/1464* (2013.01)

(58) Field of Classification Search
CPC .................... H01L 27/1464; H01L 27/14623; H01L 27/14643; H01L 27/1463
USPC .................................. 257/294, 435, 437, 447
See application file for complete search history.

(56) References Cited

U.S. PATENT DOCUMENTS

| | | | |
|---|---|---|---|
| 8,698,265 B2 | 4/2014 | Yoon | |
| 2010/0201834 A1 | 8/2010 | Maruyama et al. | |
| 2012/0061789 A1* | 3/2012 | Yang et al. | 257/443 |
| 2014/0015600 A1* | 1/2014 | Sato | 327/538 |
| 2014/0043512 A1* | 2/2014 | Kobayashi et al. | 348/308 |
| 2014/0061839 A1* | 3/2014 | Ting et al. | 257/435 |
| 2014/0077323 A1* | 3/2014 | Velichko et al. | 257/432 |

FOREIGN PATENT DOCUMENTS

| | | |
|---|---|---|
| JP | 2010186818 A | 8/2010 |
| KR | 20120001895 A | 1/2012 |

\* cited by examiner

*Primary Examiner* — Ngan Ngo
(74) *Attorney, Agent, or Firm* — Slater and Matsil, L.L.P.

(57) ABSTRACT

A backside illumination image sensor structure comprises an image sensor formed adjacent to a first side of a semiconductor substrate, wherein an interconnect layer is formed over the first side of the semiconductor substrate, a backside illumination film formed over a second side of the semiconductor substrate, a metal shielding layer formed over the backside illumination film and a via embedded in the backside illumination film and coupled between the metal shielding layer and the semiconductor substrate.

20 Claims, 10 Drawing Sheets

METAL SHIELD STRUCTURE AND METHODS FOR BSI IMAGE SENSORS

BACKGROUND

As technologies evolve, complementary metal-oxide semiconductor (CMOS) image sensors are gaining in popularity over traditional charged-coupled devices (CCDs) due to certain advantages inherent in the CMOS image sensors. In particular, a CMOS image sensor may have a high image acquisition rate, a lower operating voltage, lower power consumption and higher noise immunity. In addition, CMOS image sensors may be fabricated on the same high volume wafer processing lines as logic and memory devices. As a result, a CMOS image chip may comprise both image sensors and all the necessary logics such as amplifiers, A/D converters and the like.

CMOS image sensors are pixelated metal oxide semiconductors. A CMOS image sensor typically comprises an array of light sensitive picture elements (pixels), each of which may include transistors (switching transistor and reset transistor), capacitors, and a photo-sensitive element (e.g., a photo-diode). A CMOS image sensor utilizes light-sensitive CMOS circuitry to convert photons into electrons. The light-sensitive CMOS circuitry typically comprises a photo-diode formed in a silicon substrate. As the photo-diode is exposed to light, an electrical charge is induced in the photo-diode. Each pixel may generate electrons proportional to the amount of light that falls on the pixel when light is incident on the pixel from a subject scene. Furthermore, the electrons are converted into a voltage signal in the pixel and further transformed into a digital signal by means of an A/D converter. A plurality of periphery circuits may receive the digital signals and process them to display an image of the subject scene.

A CMOS image sensor may comprise a plurality of additional layers such as dielectric layers and interconnect metal layers formed on top of the substrate, wherein the interconnect layers are used to couple the photo diode with peripheral circuitry. The side having additional layers of the CMOS image sensor is commonly referred to as a front side, while the side having the substrate is referred to as a backside. Depending on the light path difference, CMOS image sensors can be further divided into two major categories, namely front-side illumination (FSI) image sensors and backside illumination (BSI) image sensors.

In a FSI image sensor, light from the subject scene is incident on the front side of the CMOS image sensor, passes through dielectric layers and interconnect layers, and finally falls on the photo diode. The additional layers (e.g., opaque and reflective metal layers) in the light path may limit the amount of light absorbed by the photo diode so as to reduce quantum efficiency. In contrast, there is no obstruction from additional layers (e.g., metal layers) in a BSI image sensor. Light is incident on the backside of the CMOS image sensor. As a result, light can strike the photo diode through a direct path. Such a direct path helps to increase the number of photons converted into electrons.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a metal shielding layer structure for backside illuminated image sensors. The embodiments of the disclosure may also be applied, however, to a variety of image sensors. Hereinafter, various embodiments will be explained in detail with reference to the accompanying drawings.

Figure 1:
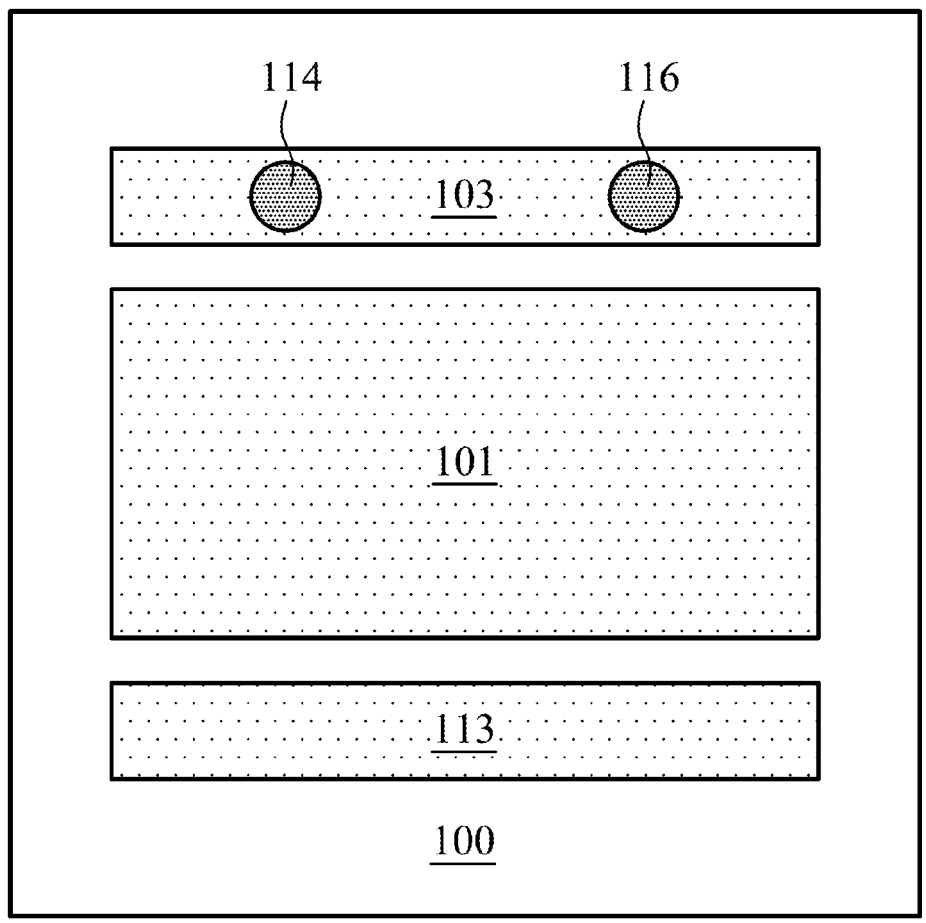
FIG. 1 illustrates a simplified top view of a backside illumination image sensor in accordance with various embodiments of the present disclosure.

FIG. 1 illustrates a simplified top view of a backside illumination image sensor in accordance with various embodiments of the present disclosure. The backside illumination image sensor 100 comprises an image sensor pixel array 101, a black level correction region 103 and a logic circuit region 113. The image sensor pixel array 101 may comprise a plurality of photo diodes (not shown but illustrated in FIG. 2).

Each photo diode may include a photo sensitive p-n junction and associated transistors for receiving signals from the photo sensitive p-n junction. When a photo diode is exposed to light, the photo diode may generate an electrical signal proportional to the amount of light that falls on the photo diode.

The logic circuit region 113 may be formed adjacent to the image sensor pixel array 101. The logic circuit region 113 may include logic circuitry for operating the image sensor pixel array 101 and circuitry for communicating the data corresponding to the sensed light to external devices.

The black level correction region 103 may comprise a plurality of black level reference sensors (not shown). The black level reference sensors are formed underlying a metal shielding layer. As such, the light striking the image sensor pixel array 101 may not reach the black level reference sensors. As a result, the black level reference sensors may provide a reference signal for calibrating the active image sensors formed in the image sensor pixel array 101.

FIG. 1 further illustrates there may be a plurality of vias (e.g., vias 114 and 116) formed in the black level correction region 103. More particularly, the vias 114 and 116 are formed between the metal shielding layer and the semiconductor substrate. In other words, the vias 114 and 116 couple the metal shielding layer with the semiconductor substrate underlying the metal shielding layer. The detailed structure of the metal shielding layer will be described below with respect to FIG. 2.

During various steps of fabricating the backside illumination image sensor 100, there may be accumulated charge on the surface of the backside illumination image sensor 100. In particular, the accumulated charge may stay on top of the metal shielding layer of the black level correction region 103. Such accumulated charge may cause problems such as noise, dark current, color mixing and the like. The vias 114 and 116 can provide a discharge path between the metal shielding layer and the grounding layer of the semiconductor substrate. Such a discharge path helps to eliminate accumulated charge so that the key device characteristics such as noise, dark current and the like may be improved.

Figure 2:
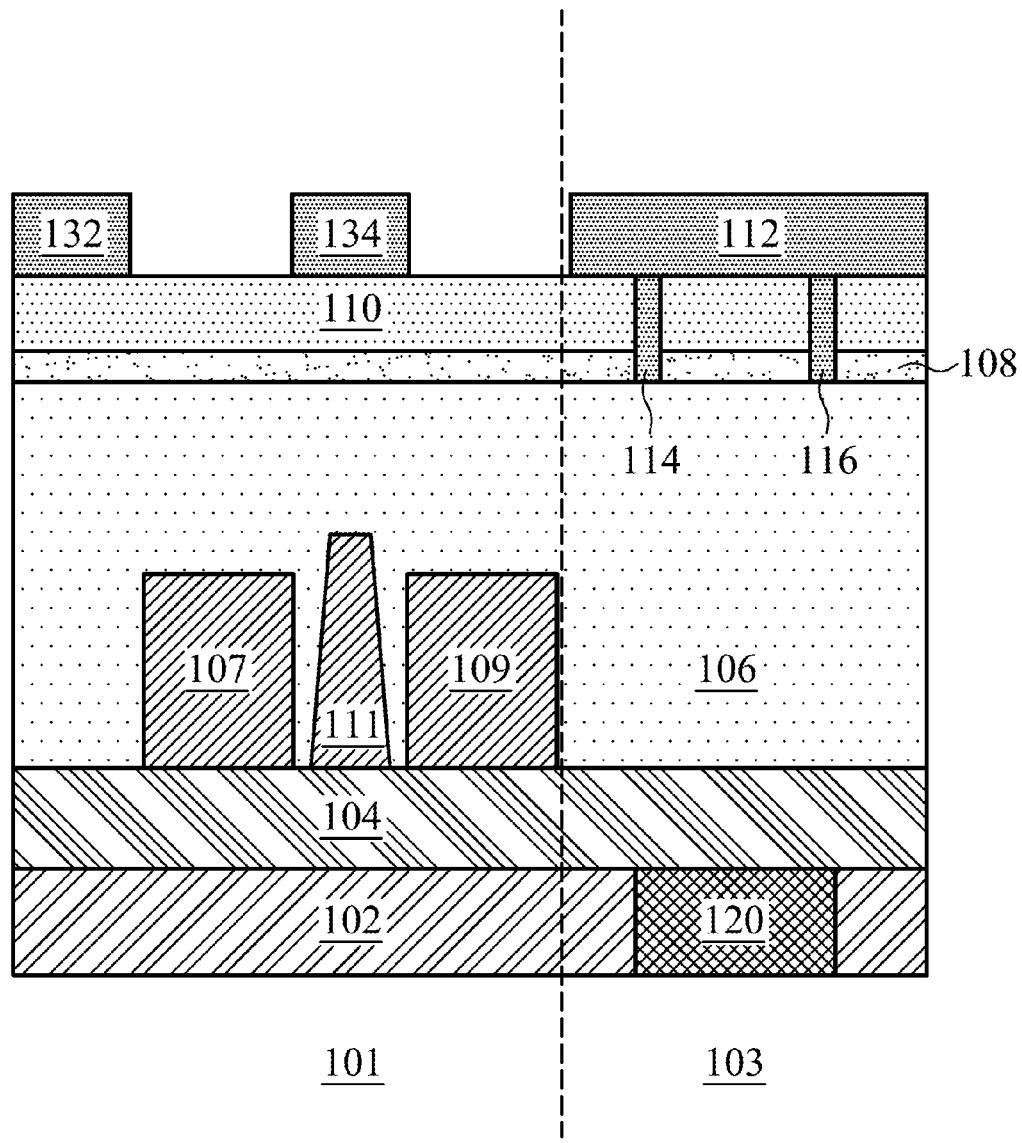
FIG. 2 illustrates a cross sectional view of the backside illumination image sensor shown in FIG. 1 in accordance with various embodiments of the present disclosure.

FIG. 2 illustrates a cross sectional view of the backside illumination image sensor shown in FIG. 1 in accordance with various embodiments of the present disclosure. For simplicity, the cross sectional view of the backside illumination image sensor 100 shown in FIG. 2 only illustrates the image sensor pixel array 101 and the black level correction region 103.

The image sensor pixel array 101 may comprise a plurality of photo diodes (e.g., photo diodes 107 and 109) formed adjacent to a first side of a semiconductor substrate 106. Two adjacent photo diodes are separated from each other by an isolation region 111. The photo diodes 107 and 109 are used for generating electrical signals from the sensed light. As shown in FIG. 2, grids 132 and 134 are formed on a second side of the semiconductor substrate 106. The photo diodes (e.g., photo diode 107) are formed between two adjacent grids such as grids 132 and 134. In other words, two adjacent grids (e.g., grids 132 and 134) define a pixel region of the image sensor pixel array 101. The grids 132 and 134 may be formed of a variety of suitable materials such as, for example, tungsten, aluminum, copper, an alloy or a composite, any combinations thereof and/or the like.

The black level correction region 103 may comprise a black reference sensor (not shown), which is used for generating reference black level signals. As shown in FIG. 2, the black reference sensor located in the black level correction region 103 is shielded by a metal shielding layer 112. As a result, light does not strike the black reference sensor. Without receiving light, the black reference sensor can provide a black reference signal for the image sensor pixel array 101. Throughout the description, the black level correction region 103 is alternatively referred to as the metal shield region 103.

As described above with respect to FIG. 1, the metal shielding layer 112 of the black level correction region 103 is coupled to the top surface of the semiconductor substrate 106 through a plurality of vias (e.g., vias 114 and 116). Furthermore, the vias 114 and 116 function as grounding vias. In other words, the vias 114 and 116 may be connected to a ground plane of the semiconductor substrate 106. The vias 114 and 116 are embedded in a backside illumination film including an anti-reflective coating layer 108 and a dielectric layer 110. The detailed fabrication process of the backside illumination image sensor 100 will be described below with respect to FIGS. 3-10.

Figure 3:
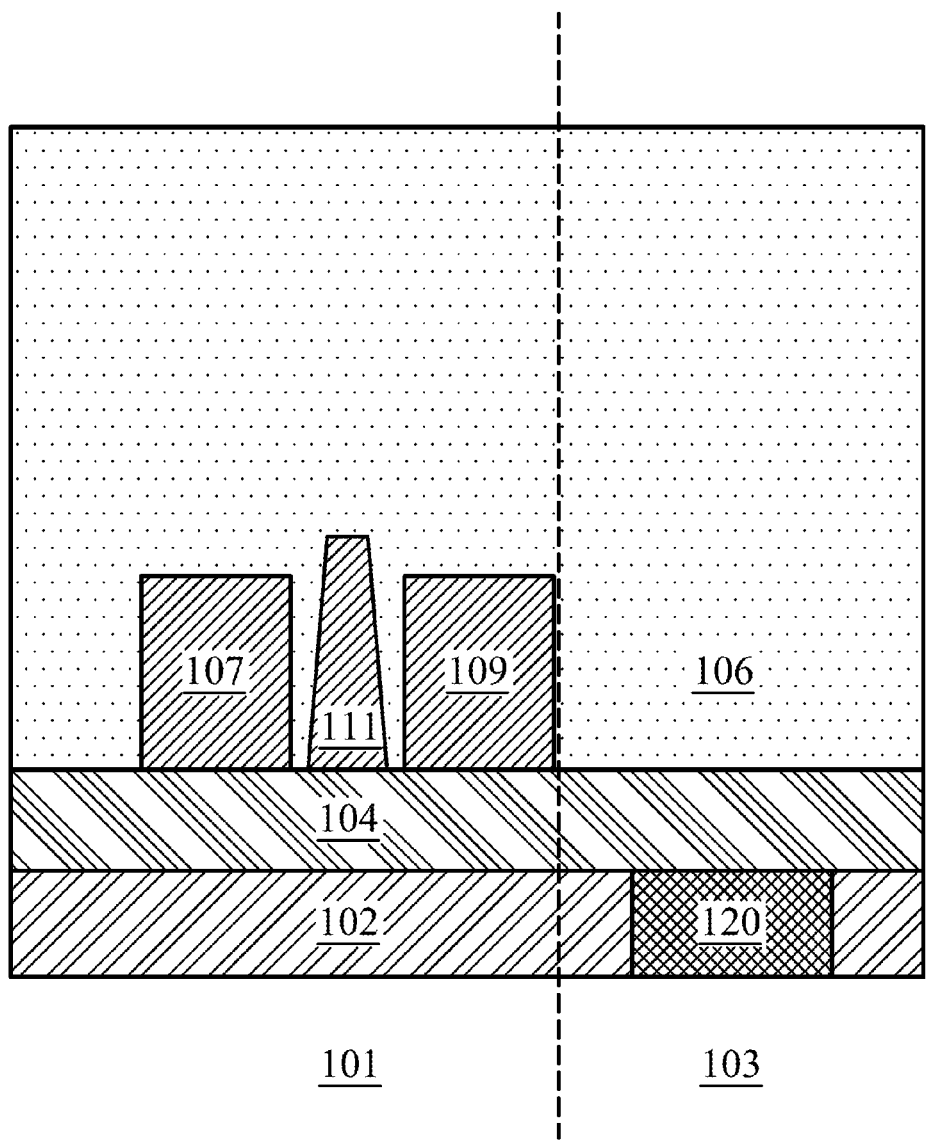
FIG. 3 illustrates a cross sectional view of a semiconductor substrate in accordance with various embodiments of the present disclosure.

FIGS. 3-10 illustrate a method of fabricating the backside illumination image sensor 100 in accordance with various embodiments of the present disclosure. FIG. 3 illustrates a cross sectional view of a semiconductor substrate in accordance with various embodiments of the present disclosure. The substrate 106 may be of a first conductivity. In accordance with an embodiment, the substrate 106 is a highly doped p-type substrate. The substrate 106 may be formed of silicon, germanium, silicon germanium, graded silicon germanium, semiconductor-on-insulator, carbon, quartz, sapphire, glass, or the like, and may be multi-layered (e.g., strained layers). A lightly doped p-type epitaxial layer (not shown) may be grown on the highly doped p-type substrate 106.

The substrate 106 may comprise a plurality of photo active regions. The photo active regions may comprise, for example, photo-diodes (e.g., photo active region 107) formed by implanting impurity ions into the epitaxial layer. Furthermore, the photo active regions may be a PN junction photodiode, a PNP photo-transistor, an NPN photo-transistor or the like. In accordance with an embodiment, the photo active regions such as photo active region may comprise a p-type layer formed on an n-type region, wherein the n-type region is formed on an epitaxial layer grown from a p-type semiconductor substrate.

In accordance with an embodiment, n-type impurity ions are implanted into the p-type epitaxial layer to form an n-type photo diode region (not shown). In addition, p-type impurity ions are implanted into the n-type photo diode region to form a p-type diode region (not shown). The n-type photo diode region and the p-type photo diode region further form a photo diode region (e.g., photo diodes 107 and 109).

The substrate 106 may comprise a plurality of pixels, each of which comprises a photo diode region (e.g., photo diode 107). In order to prevent crosstalk between adjacent pixels, an isolation region 111 is employed to separate two adjacent photo diodes. In accordance with some embodiments, the isolation region 111 may be a shallow trench isolation (STI) structure. The STI structure may be formed by etching a portion of the substrate 106 to form a trench and filling the trench with oxide and/or other dielectric materials.

A dielectric layer 104 is typically formed over the first side of the substrate 106. In accordance with an embodiment, the dielectric layer 104 may be formed of low-K dielectric materials such as silicon oxide, borophosphosilicate glass (BPSG), phosphosilicate glass (PSG), fluorinated silicate glass (FSG), carbon-doped silicon oxide or the like. The dielectric layer 104 may be formed by any suitable techniques such as chemical vapor deposition (CVD) techniques or the like.

A metal interconnect layer 102 may be formed over the dielectric layer 104. The metal interconnect layer 102 may comprise a plurality of metal lines 120. The metal interconnect layer 102 can be patterned by plasma etching or a damascene process and may be formed of any conductive material suitable for the particular application. Materials that may be suitable include, for example, aluminum, copper, doped polysilicon or the like. Contacts and vias (not shown) may be formed to provide electrical connectivity between the metal interconnect layer 102 and underlying circuitry (not shown).

It should be noted that for simplicity, hereinafter the side having additional layers (e.g., dielectric layer 104) of the backside illuminated image sensor 100 is referred to as a front side, while the side having the substrate 106 is referred to as a backside.

Figure 4:
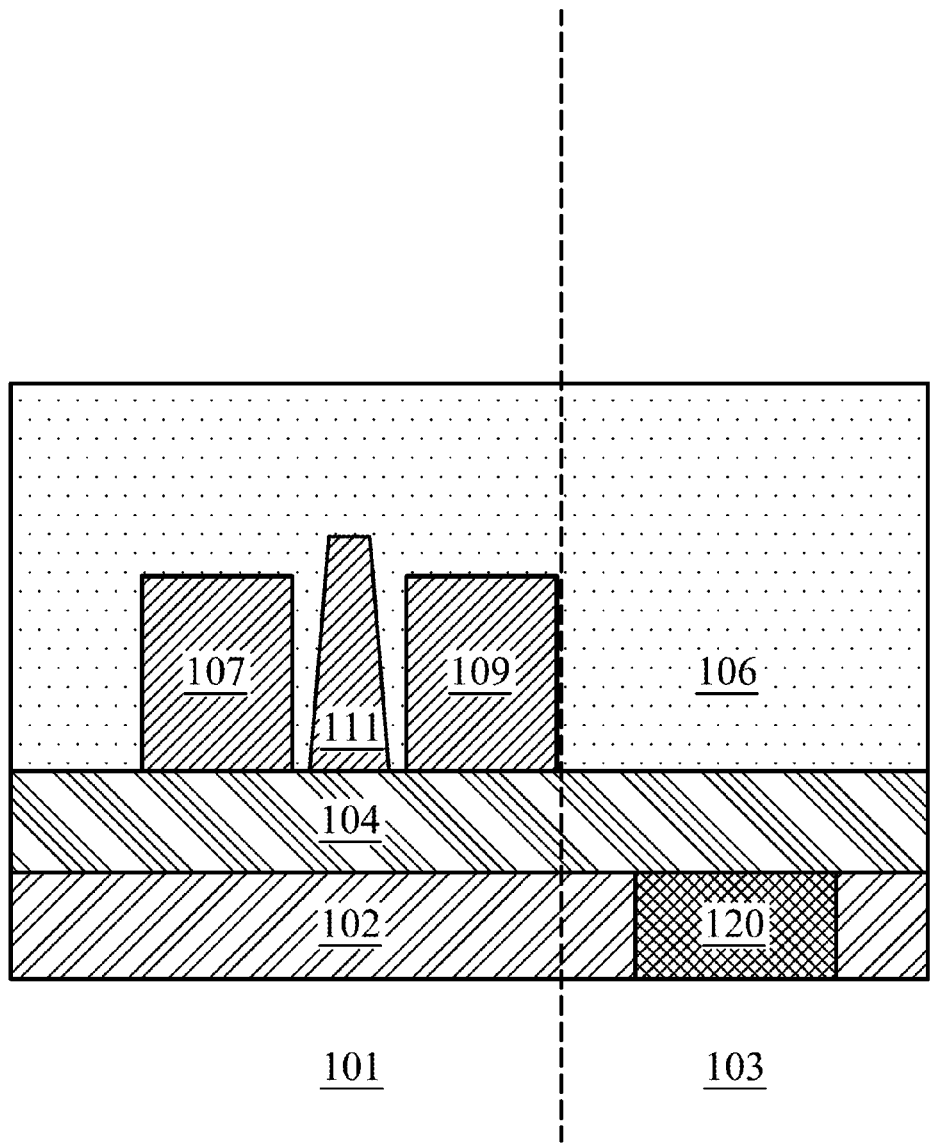
FIG. 4 is a cross sectional view of the semiconductor device illustrated in FIG. 3 after a thinning process has been applied to the backside of the substrate in accordance with various embodiments of the present disclosure.

FIG. 4 is a cross sectional view of the semiconductor device illustrated in FIG. 3 after a thinning process has been applied to the backside of the substrate in accordance with various embodiments of the present disclosure. The substrate 106 prior to a thinning process is of a thickness in a range from about 700 um to about 800 um. According to the fabrication processes of backside illuminated image sensors, the backside of the substrate 106 is thinned until the highly doped p-type substrate 106 is removed and the lightly doped p-type epitaxial layer is exposed. More particularly the backside of the substrate 106 of the backside illuminated image sensor 100 may be thinned to a thickness in a range from about 3 um to about 4 um. Such a thin substrate layer allows light to pass through the substrate and hit photo diodes (e.g., photo diodes 107 and 109) embedded in the substrate without being absorbed by the substrate. The thinning process may be implemented by using suitable techniques such as grinding, polishing and/or chemical etching.

Figure 5:
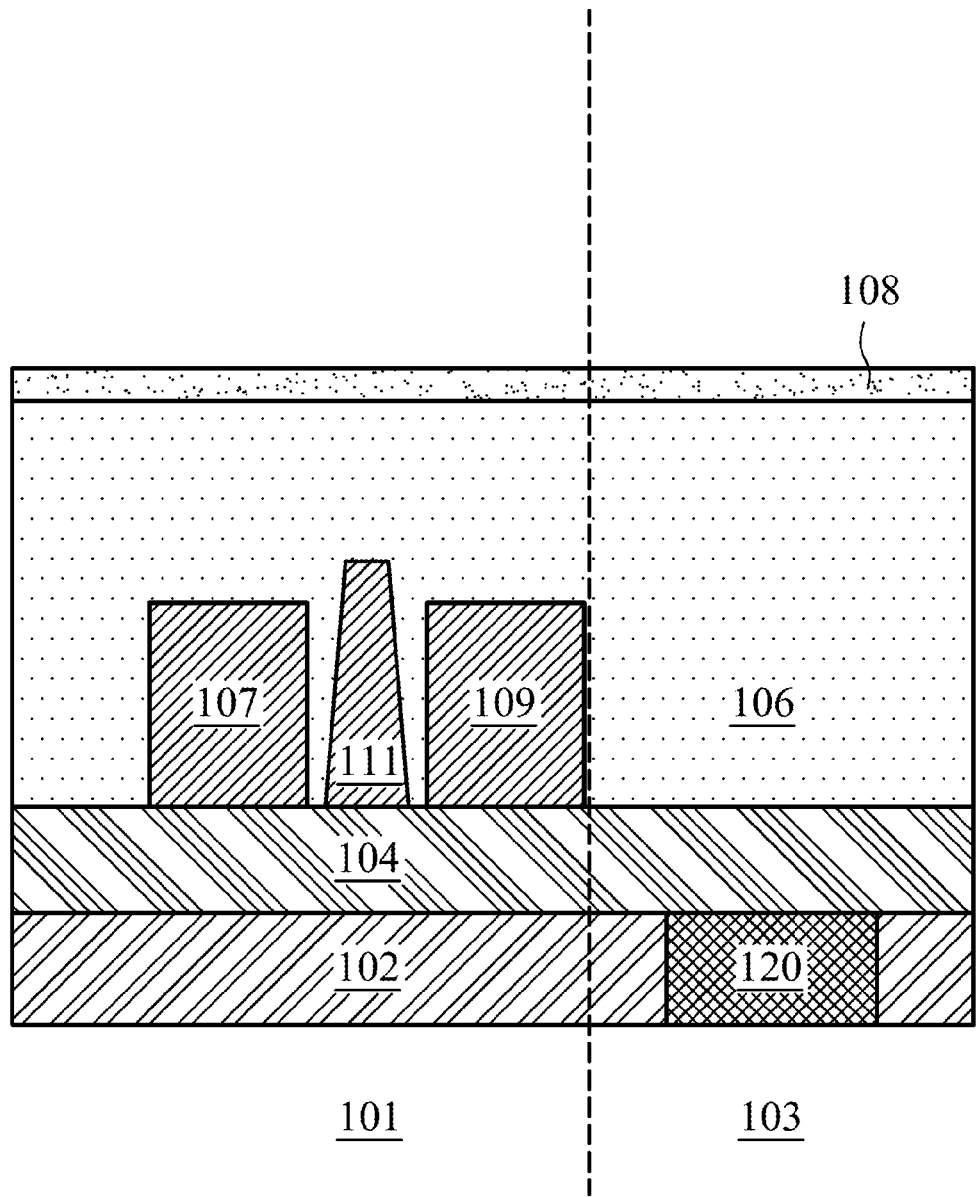
FIG. 5 is a cross sectional view of the semiconductor device illustrated in FIG. 4 after an anti-reflection coating (ARC) layer is deposited over the backside of the substrate in accordance with various embodiments of the present disclosure.

FIG. 5 is a cross sectional view of the semiconductor device illustrated in FIG. 4 after an anti-reflection coating (ARC) layer is deposited over the backside of the substrate in accordance with various embodiments of the present disclosure. The ARC layer 108 is formed over the backside of the substrate 106. The ARC layer 108 may be formed of a nitride material, an organic material, an oxide material and the like. The ARC layer 108 may be formed using suitable techniques such as CVD and the like.

Figure 6:
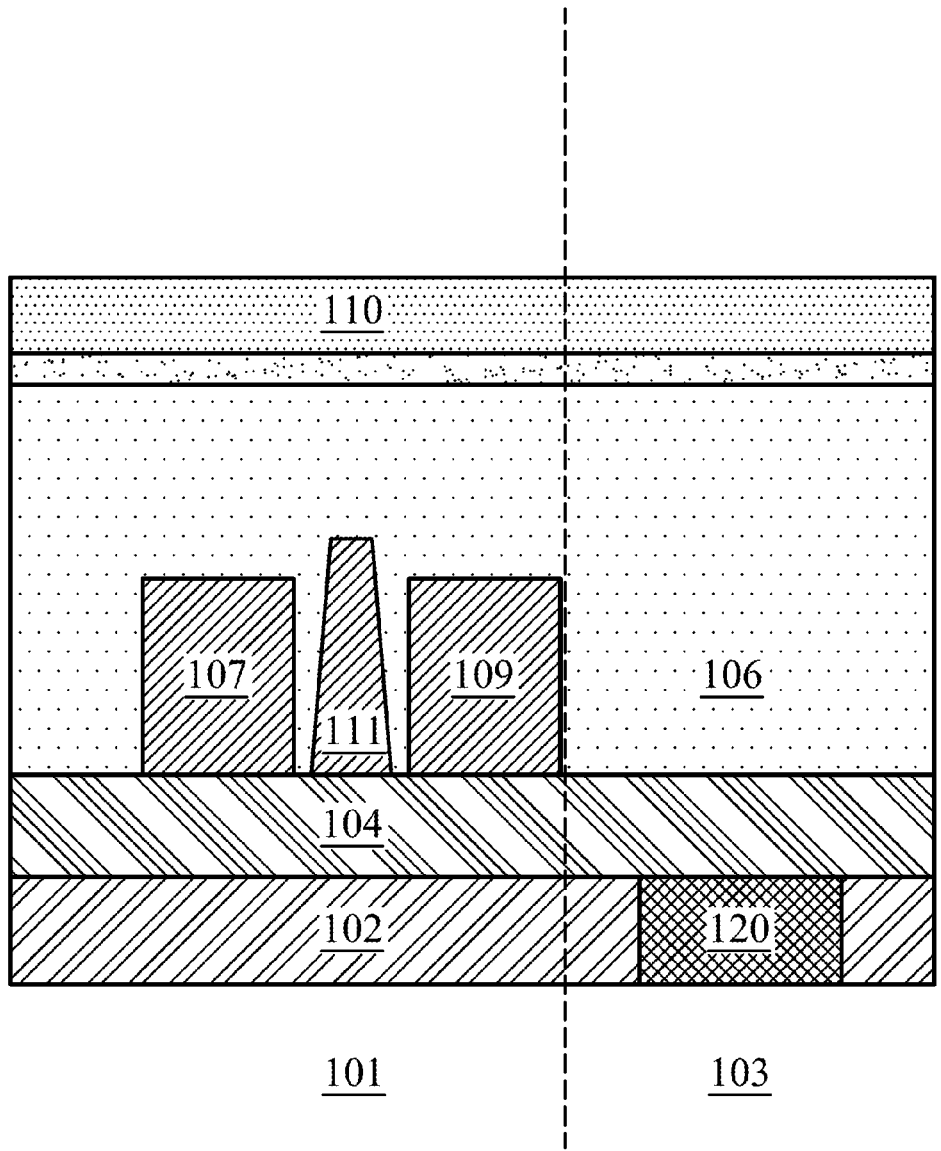
FIG. 6 is a cross sectional view of the semiconductor device illustrated in FIG. 5 after a dielectric layer is formed over the ARC layer in accordance with various embodiments of the present disclosure.

FIG. 6 is a cross sectional view of the semiconductor device illustrated in FIG. 5 after a dielectric layer is formed over the ARC layer in accordance with various embodiments of the present disclosure. The dielectric layer 110 may be formed of oxide. More particularly, the dielectric layer 110 may comprise a first oxide layer, a second oxide layer and a buffer oxide layer (not shown respectively).

In some embodiments, the first oxide layer is a plasma enhanced oxide (PEOX) having a thickness of about 1100 Angstroms. In some embodiments, the second oxide layer is a low deposited rate resistor protection oxide (LRPO) having a thickness of about 4200 Angstroms. In some embodiments, the buffer oxide layer is a plasma enhanced oxide (PEOX) having a thickness of about 500 Angstroms. As such, the dielectric layer 110 is of a collective thickness of about 5800 Angstroms. It should be noted that, throughout the description, the ARC layer 108 and the dielectric layer 110 may be collectively referred to as a backside illumination film.

Figure 7:
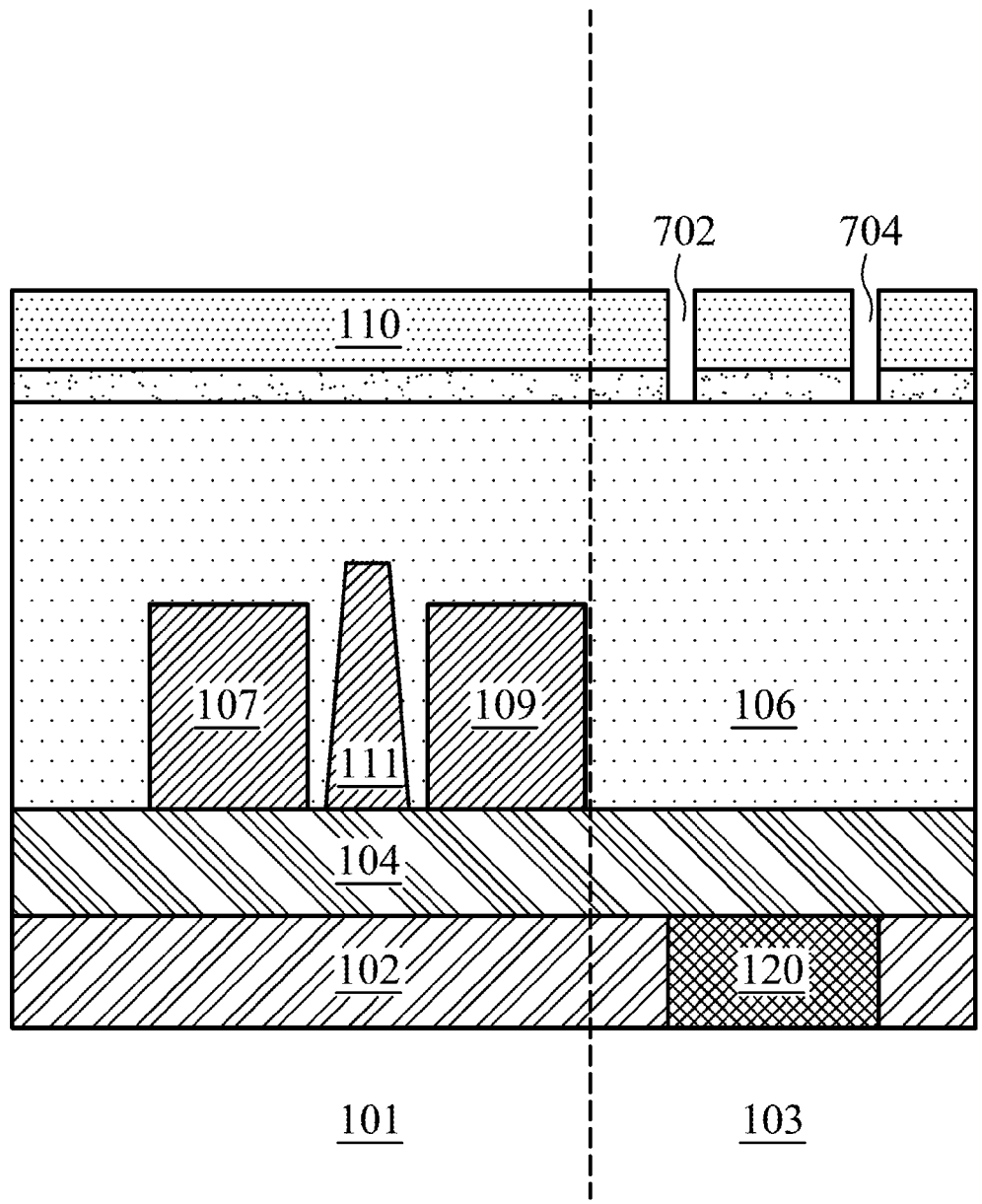
FIG. 7 illustrates a cross sectional view of the semiconductor device shown in FIG. 6 after a patterning process is applied to the backside illumination film in accordance with various embodiments of the present disclosure.

FIG. 7 illustrates a cross sectional view of the semiconductor device shown in FIG. 6 after a patterning process is applied to the backside illumination film in accordance with various embodiments of the present disclosure. In consideration of the location and shape of the vias 114 and 116 shown in FIG. 2, selective areas of the dielectric layer 110 and the ARC layer 108 are removed to form the openings 702 and 704 through suitable semiconductor etching techniques.

Figure 8:
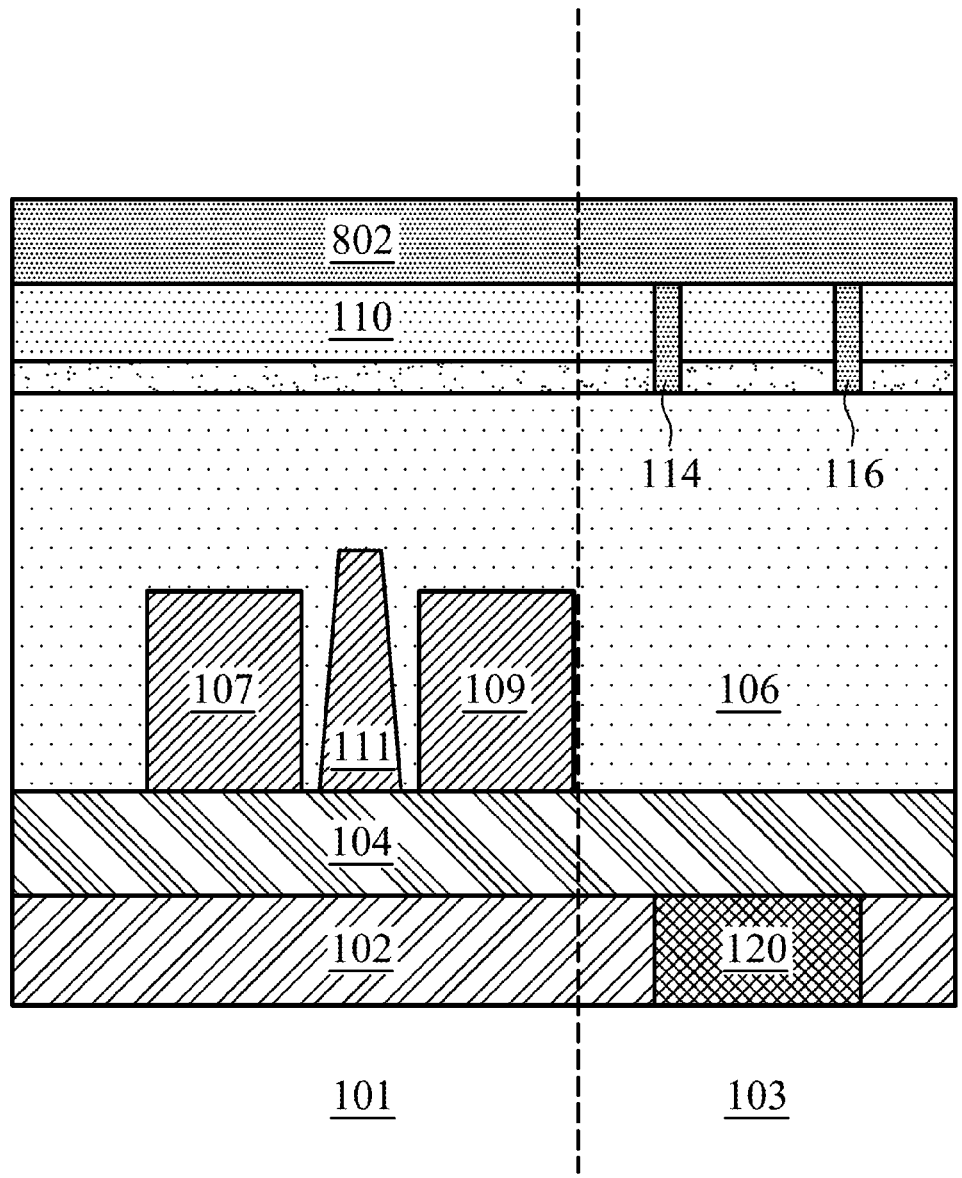
FIG. 8 illustrates a cross sectional view of the semiconductor device shown in FIG. 7 after a metal layer is deposited over the backside illumination film in accordance with various embodiments of the present disclosure.

FIG. 8 illustrates a cross sectional view of the semiconductor device shown in FIG. 7 after a metal layer is deposited over the backside illumination film in accordance with various embodiments of the present disclosure. As shown in FIG. 8, the openings may be filled with metal materials to form the vias 114 and 116. The metal layer 802 is formed over the dielectric layer 110. In accordance with an embodiment, the metal materials filled in the openings and deposited over the dielectric layer 110 include copper, aluminum, tantalum, titanium nitride, combinations thereof and/or the like. The metal layer 802 is of a thickness in a range from about 50 nm to about 200 nm.

In accordance with an embodiment, the metal materials may be filled in the opening using a suitable deposition process such as CVD, plasma enhanced CVD (PECVD), atomic layer deposition (ALD), electroplating and/or the like.

It should be noted that there may be a seed layer (not shown) formed between the bottom surfaces of the vias and the top surface of the substrate 106. The seed layer may be may be formed of titanium, tantalum, titanium silicon composite materials, tantalum silicon composite material, any combination thereof and/or the like. The seed layer may be formed by suitable deposition techniques such as physical vapor deposition (PVD), CVD and/or the like. The seed layer may have a thickness of between about 40 Å and about 100 Å. The seed layer may help to improve the adhesive properties of the metal layer 802 as well as the vias 114 and 116.

It should further be noted that there may be a metal silicide layer (not shown) formed on the top surface on the substrate 106. The metal silicide layer may be generated through a plurality of thermal processes commonly employed in the semiconductor fabrication process. Alternatively, the metal silicide layer may be generated by a substrate surface treatment process such as a SiH4 pre-treatment.

Figure 9:
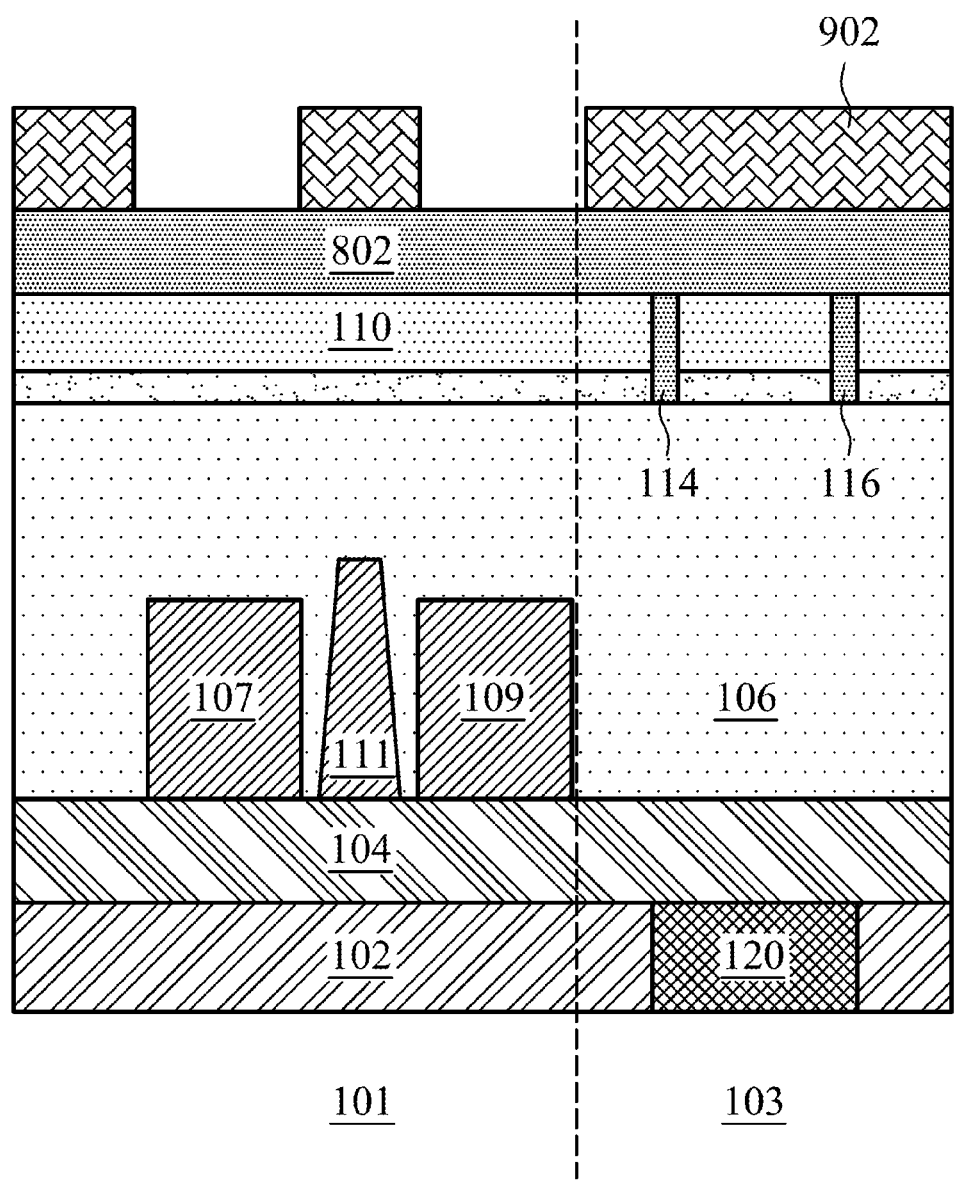
FIG. 9 illustrates a cross sectional view of the semiconductor device shown in FIG. 8 after a backside metal grid photolithography process is performed using a photo resist in accordance with various embodiments of the present disclosure.

FIG. 9 illustrates a cross sectional view of the semiconductor device shown in FIG. 8 after a backside metal grid photolithography process is performed using a photo resist in accordance with various embodiments of the present disclosure. A photoresist material is deposited on the metal layer 802 to form a photo resist layer 902. According to the location and shape of the grids and metal shielding layer shown in FIG. 2, portions of the photo resist layer 902 are exposed. The patterning process shown in FIG. 9 is well known, and hence is not discussed in further detail.

Figure 10:
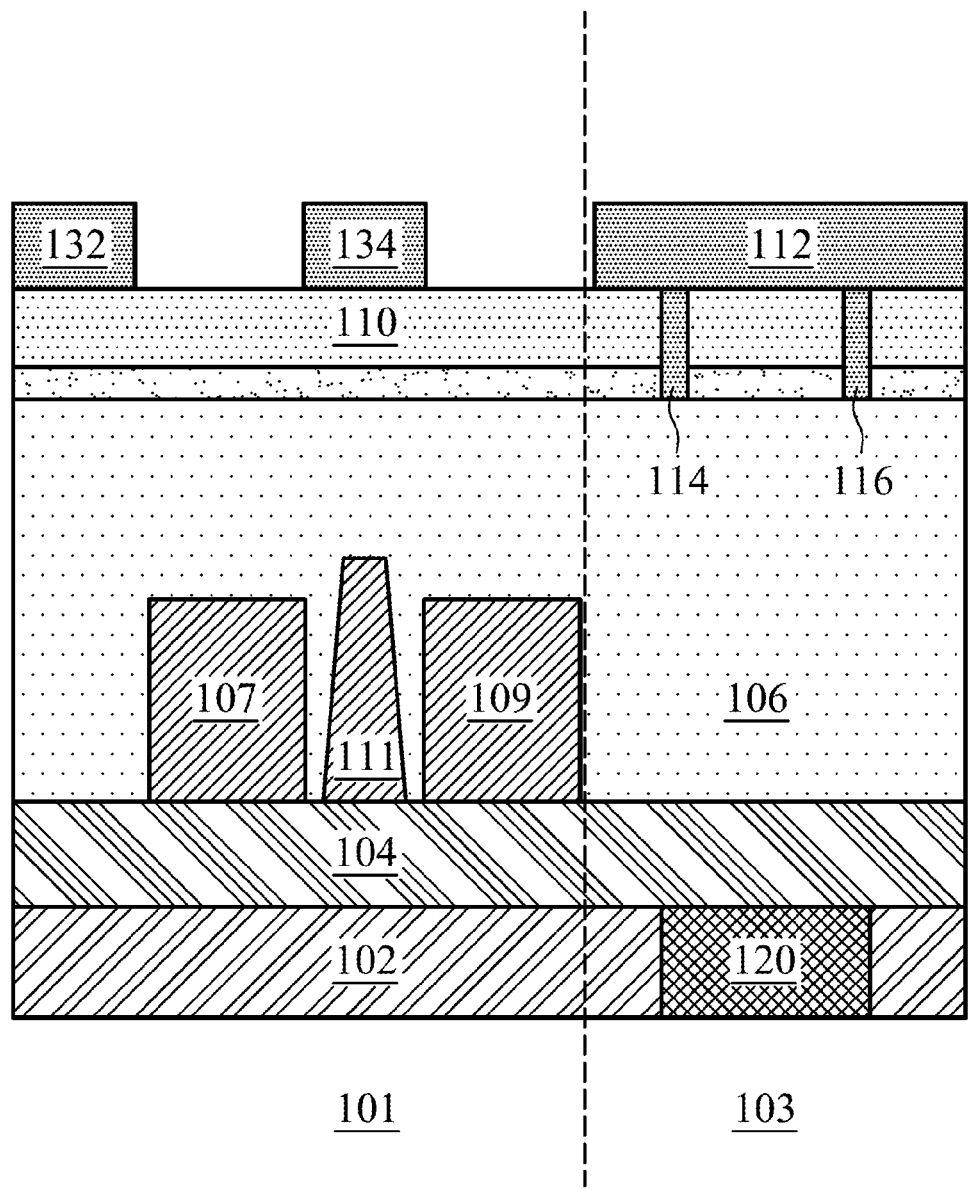
FIG. 10 illustrates a cross sectional view of the semiconductor device shown in FIG. 9 after an etching process is performed in accordance with various embodiments of the present disclosure.

FIG. 10 illustrates a cross sectional view of the semiconductor device shown in FIG. 9 after an etching process is performed in accordance with various embodiments of the present disclosure. An etching process, such as an anisotropic dry etch process, may be used to remove portions of the metal layer 802 to form the grids 132, 134 and the metal shielding layer 112.

In accordance with an embodiment, an apparatus comprises an image sensor formed adjacent to a first side of a semiconductor substrate, wherein an interconnect layer is formed over the first side of the semiconductor substrate, a backside illumination film formed over a second side of the semiconductor substrate, a metal shielding layer formed over the backside illumination film and a via embedded in the backside illumination film and coupled between the metal shielding layer and the semiconductor substrate.

In accordance with another embodiment, a method comprises forming an image sensor adjacent to a first side of a substrate, forming a backside illumination layer on a second side of the substrate, patterning the backside illumination layer to form a via, forming a metal layer over the backside illumination layer and patterning the metal layer to form a metal shielding layer, wherein the metal shielding layer is connected to the substrate through the via.

In accordance with yet another embodiment, a device comprises an array of photo diodes, each of which is formed adjacent to a first side of a semiconductor substrate, a plurality of isolation regions, each of which is formed between two adjacent photo diodes and a black level correction region.

The black level correction region comprises a metal shielding layer and a first via having a first terminal contacting the metal shielding layer and a second terminal contacting a second side of the semiconductor substrate.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
an image sensor formed adjacent to a first side of a semiconductor substrate, wherein an interconnect layer is formed over the first side of the semiconductor substrate;
a backside illumination film formed over a second side of the semiconductor substrate;
a metal shielding layer formed over the backside illumination film; and
a via embedded in the backside illumination film and coupled between the metal shielding layer and the semiconductor substrate.

2. The apparatus of claim 1, further comprising:
an anti-reflection coating layer formed on the second side of the semiconductor substrate; and
a dielectric layer formed on the anti-reflection coating layer.

3. The apparatus of claim 1, further comprising:
an epitaxial layer grown in the semiconductor substrate;
the image sensor embedded in the epitaxial layer; and
an isolation region embedded in the epitaxial layer, wherein the image sensor is enclosed by the isolation region.

4. The apparatus of claim 1, wherein:
the metal shielding layer is of a thickness in a range from about 50 nm to about 200 nm.

5. The apparatus of claim 1, wherein:
the metal shielding layer comprises copper.

6. The apparatus of claim 1, further comprising:
a seed layer formed between the metal shielding layer and the backside illumination film, wherein the seed layer is of a thickness in a range from about 40 Angstroms to about 100 Angstroms.

7. The apparatus of claim 1, wherein:
the via is a grounding via connected to a ground plane of the semiconductor substrate.

8. A device comprising:
an array of photo diodes, each of which is formed adjacent to a first side of a semiconductor substrate;
a plurality of isolation regions, each of which is formed between two adjacent photo diodes; and
a black level correction region comprising:
a metal shielding layer; and
a first via having a first terminal contacting the metal shielding layer and a second terminal contacting a second side of the semiconductor substrate.

9. The device of claim 8, further comprising:
a backside illumination film formed over the second side of the semiconductor substrate; and
a plurality of grids formed over the backside illumination film.

10. The device of claim 9, wherein:
the plurality of grids are metal lines.

11. The device of claim 9, wherein the backside illumination film comprises:
an anti-reflection coating layer formed on the second side of the semiconductor substrate; and
a dielectric layer formed on the anti-reflection coating layer.

12. The device of claim 9, wherein:
the photo diode is underlying and aligned with two adjacent grids.

13. The device of claim 9, further comprising:
a second via coupled between the metal shielding layer and the semiconductor substrate, wherein the second via is embedded in the backside illumination film.

14. A device comprising:
an image sensor region comprising:
a plurality of photo diodes in a substrate;
an anti-reflection coating layer over the substrate;
a dielectric layer over the anti-reflection coating layer; and
a plurality of grids over the dielectric layer; and
a black level correction region adjacent to the image sensor region, wherein the black level correction region comprises:
a metal shielding layer over the dielectric layer; and
a plurality of vias between the metal shielding layer and the substrate, wherein the vias extend through the dielectric layer and the anti-reflection coating layer.

15. The device of claim 14, wherein:
the vias are connected to a ground plane of the substrate.

16. The device of claim 14, further comprising:
a first photo diode adjacent to a first side of the substrate; and
a second photo diode adjacent to the first side of the substrate, wherein the first photo diode and the second photo diode are separated by an isolation region.

17. The device of claim 16, wherein:
the anti-reflection coating layer is on a second side of the substrate.

18. The device of claim 16, further comprising:
a metal interconnect layer over the first side of the substrate.

19. The device of claim 14, wherein:
the metal shielding layer is formed of copper.

20. The device of claim 14, wherein:
bottom surfaces of the vias are in direct contact with a top surface of the substrate.

* * * * *